United States Patent

Coombs, III

[11] Patent Number: 5,412,180
[45] Date of Patent: May 2, 1995

[54] ULTRA HIGH VACUUM HEATING AND ROTATING SPECIMEN STAGE

[75] Inventor: Arthur W. Coombs, III, Patterson, Calif.

[73] Assignee: The Regents of the University of California, Oakland, Calif.

[21] Appl. No.: 160,263

[22] Filed: Dec. 2, 1993

[51] Int. Cl.⁶ .......................... C23C 16/46; H05B 3/68
[52] U.S. Cl. ..................................... 219/385; 219/211; 118/730; 118/725
[58] Field of Search ............... 219/385, 390, 405, 411, 219/388, 389; 437/247, 248; 118/724, 725, 730, 50.1; 392/416, 418

[56] References Cited

U.S. PATENT DOCUMENTS

| | | | |
|---|---|---|---|
| 1,158,475 | 11/1915 | Fox | 219/218 |
| 1,481,729 | 1/1924 | Nafziger | 439/27 |
| 2,634,358 | 4/1953 | Duckstein | 219/389 |
| 3,439,307 | 4/1969 | Ruscher | 439/21 |
| 3,590,243 | 6/1971 | Perrin et al. | 250/419 S |
| 3,594,680 | 7/1971 | Buschbom | 439/21 |
| 4,121,537 | 10/1978 | Maruyama | 118/730 |
| 4,227,080 | 10/1980 | Okura et al. | 250/311 |
| 4,334,844 | 6/1982 | Tanaka | 425/2 |
| 4,417,775 | 11/1983 | Sakurai | 439/13 |
| 4,427,891 | 1/1984 | Georges et al. | 250/443.1 |
| 4,447,374 | 5/1984 | Tanaka | 264/22 |
| 4,544,446 | 10/1985 | Cady | 156/639 |
| 4,821,674 | 4/1989 | deBoer | 118/730 |
| 4,950,901 | 8/1990 | Jones et al. | 250/443.1 |
| 5,008,536 | 4/1991 | Isakozawa et al. | 250/307 |
| 5,024,746 | 6/1991 | Stierman | 204/297 W |

Primary Examiner—Teresa J. Walberg
Attorney, Agent, or Firm—Henry P. Sartorio

[57] ABSTRACT

A heating and rotating specimen stage provides for simultaneous specimen heating and rotating. The stage is ideally suited for operation in ultrahigh vacuum ($1 \times 10^{-9}$ torr or less), but is useful at atmosphere and in pressurized systems as well. A specimen is placed on a specimen holder that is attached to a heater that, in turn, is attached to a top housing. The top housing is rotated relative to a bottom housing and electrically connected thereto by electrically conductive brushes. This stage is made of materials that are compatible with UHV, able to withstand high temperatures, possess low outgassing rates, are gall and seize resistant, and are able to carry substantial electrical loading without overheating.

18 Claims, 3 Drawing Sheets

ULTRA HIGH VACUUM HEATING AND ROTATING SPECIMEN STAGE

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The subject invention relates to the heating of a specimen. More specifically, it relates to the heating of a rotating specimen under ultrahigh vacuum (UHV).

2. Description of Related Art

U.S. Pat. No. 4,447,374 discloses the use of a high vacuum apparatus for preparing an electron microscopy specimen. U.S. Pat. No. 4,334,844 is directed to a method and apparatus for preparing a replica film of a specimen for use in electron microscopy and is substantially similar to U.S. Pat. No. 4,447,374. U.S. Pat. No. 3,590,243 discloses a vacuum lock and specimen carrying probe for use with mass spectrometers. Electrical connection with the sample carrier probe is made through a sliding engagement of the probe with an electrical contact support assembly that is mounted in the ion chamber. U.S. Pat. No. 4,950,901 is directed to a specimen cooling holder for side entry transmission electron microscopes.

U.S. Pat. No. 5,008,536 describes a rotating objective lens for an electron microscope which includes a mechanical stage mover and an electrical shifter for deflecting an electron beam from the specimen on the stage. U.S. Pat. No. 4,427,891 is directed to a variable temperature stage for an electron microscope comprising a stage that has a heat insulating means, a cooling head, and a specimen holder. U.S. Pat. No. 4,227,080 describes a device that shifts a frozen specimen, covers it and transfers it to a vacuum chamber for use with a scanning type electron microscope.

A need exists for a method and apparatus that can both heat and rotate a specimen under UHV to achieve a very clean and uniform surface. Existing methods for heating and cooling under UHV lack an efficient way to simultaneously heat and rotate a specimen under UHV. The subject invention provides such features.

SUMMARY OF THE INVENTION

An object of the present invention is to provide a method and apparatus for efficient and simultaneous rotation and heating of a specimen under ultrahigh vacuum (UHV).

Another object of this invention is to provide a method and apparatus for efficient and simultaneous rotation and heating of a specimen under vacuum.

A further object of the present invention is to provide a method and apparatus for efficient and simultaneous rotation and heating of a specimen.

The subject invention provides a heating and rotating specimen stage and a method for simultaneous specimen heating and rotating. The stage is ideally suited for operation in ultrahigh vacuum ($1 \times 10^{-9}$ torr or less), but is useful at atmosphere and in pressurized systems as well. A specimen is placed on a specimen holder that is attached to a heater that, in turn, is attached to a top housing. The top housing is rotated relative to a bottom housing and electrically connected thereto by electrically conductive brushes. This invention is made of materials that are compatible with UHV, able to withstand high temperatures, possess low outgassing rates, are gall and seize resistant, and are able to carry substantial electrical loading without overheating.

DETAILED DESCRIPTION OF THE INVENTION

Figure 1:
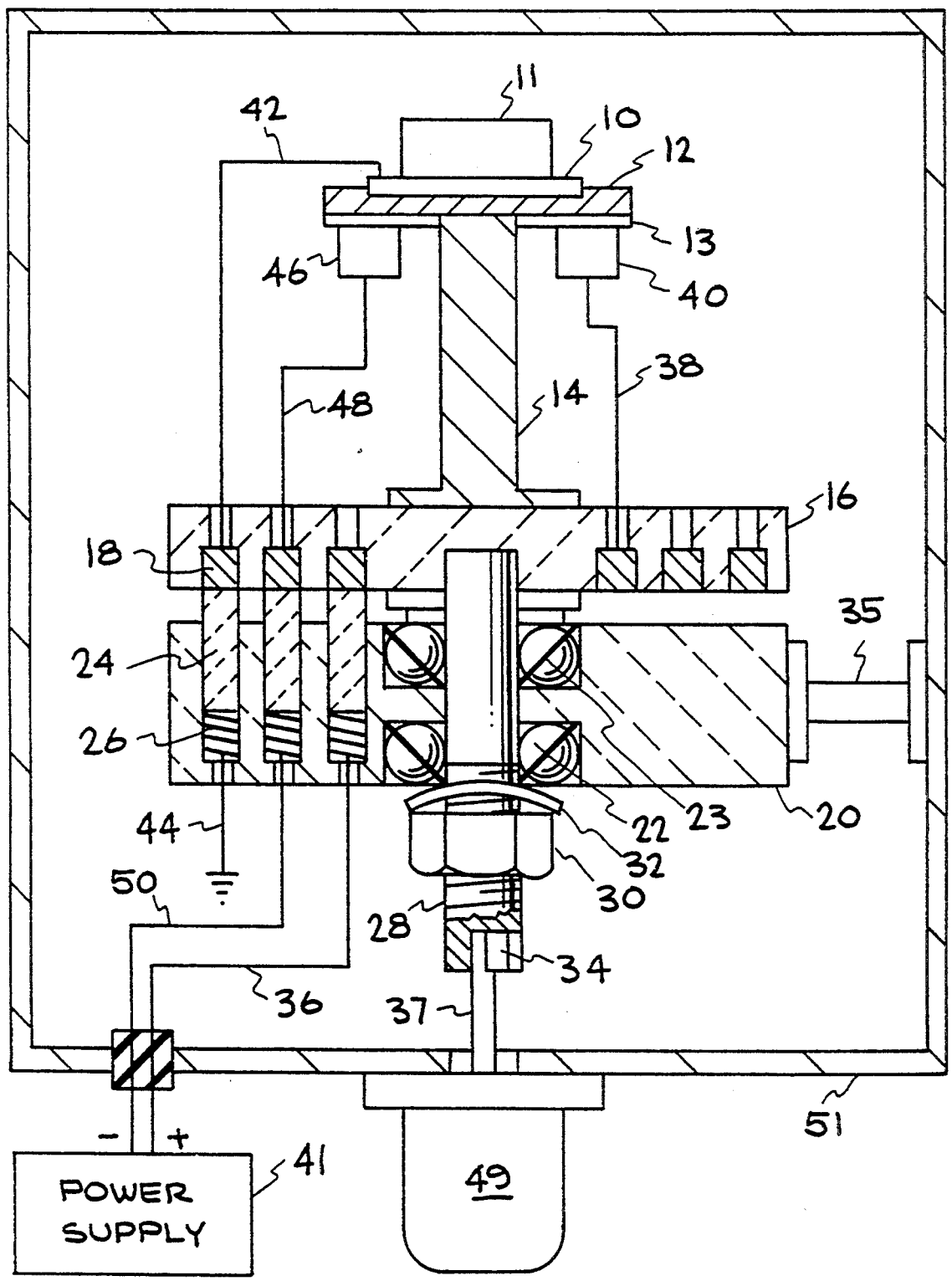
FIG. 1 is an illustration of the invention.

A specimen holder 10, as shown in FIG. 1, rigidly supports specimen 11 and is connected to a heater 12 bonded to a tantalum plate 13 which is fixedly supported by heater stand 14. Heater stand 14 is rigidly connected to a rotary bearing top housing 16 which fixedly supports electrical bearing rings 18a, 18b, 18c, comprised of stainless steel 304. A rotary bearing bottom housing 20 seats ball bearings 22, with retainer wires 23 and copper graphite brushes 24a, 24b, 24c, comprised of oxygen free copper and less than 2% graphite, supply electrical contact to the electrical bearing rings 18a, 18b, 18c. Stainless steel springs 26a, 26b, 26c, supply linear loading to the copper graphite brushes 24a, 24b, 24c. A thrust bearing shaft 28 is connected to rotary top housing 16 on the opposite side of heater stand 14. Thrust bearing shaft 28 extends through rotary bearing bottom housing 20 which is held onto thrust bearing shaft 28 with a locking jam nut 30. To allow for expansion, a wave spring washer 32 is located between locking jam nut 30 and rotary bearing bottom housing 20. Thrust bearing shaft 28 has a key slot at 34 to facilitate rotation. Ball bearings 22 located within rotary bearing bottom housing 20 allow thrust bearing shaft 28 to rotate.

Positive electrical lead 36 is connected through stainless steel spring 26c, copper graphite brush 24c, electrical bearing ring 18c, solid copper lead 38 and through contact 40 to supply current to heater 12. Heater 12 is grounded to power supply 41 through contact 46, heater ground lead 48, electrical bearing ring 18b, copper graphite brush 24b, stainless steel spring 26b, and heater ground 50. Specimen holder 10 is grounded to earth through specimen holder ground lead 42, electrical bearing ring 18a, copper graphite brush 24a, stainless steel spring 26a, and specimen holder earth ground 44. A supporting rod is rigidly connected on one end to rotary bearing bottom housing 20 and on the other end to vacuum chamber 51 within which is located the heating and rotating specimen stage. A drive shaft 37 is attached to the rotating shaft of motor 39 and extends through a wall of vacuum chamber 51 to connect to key slot 34 providing rotation of top housing 16 with respect to bottom housing 20. The positive terminal of power supply 41 is electrically connected through chamber 51 to positive electrical lead 36. The negative terminal of power supply 41 is electrically connected through chamber 51 to heater ground 50.

Figure 2A:
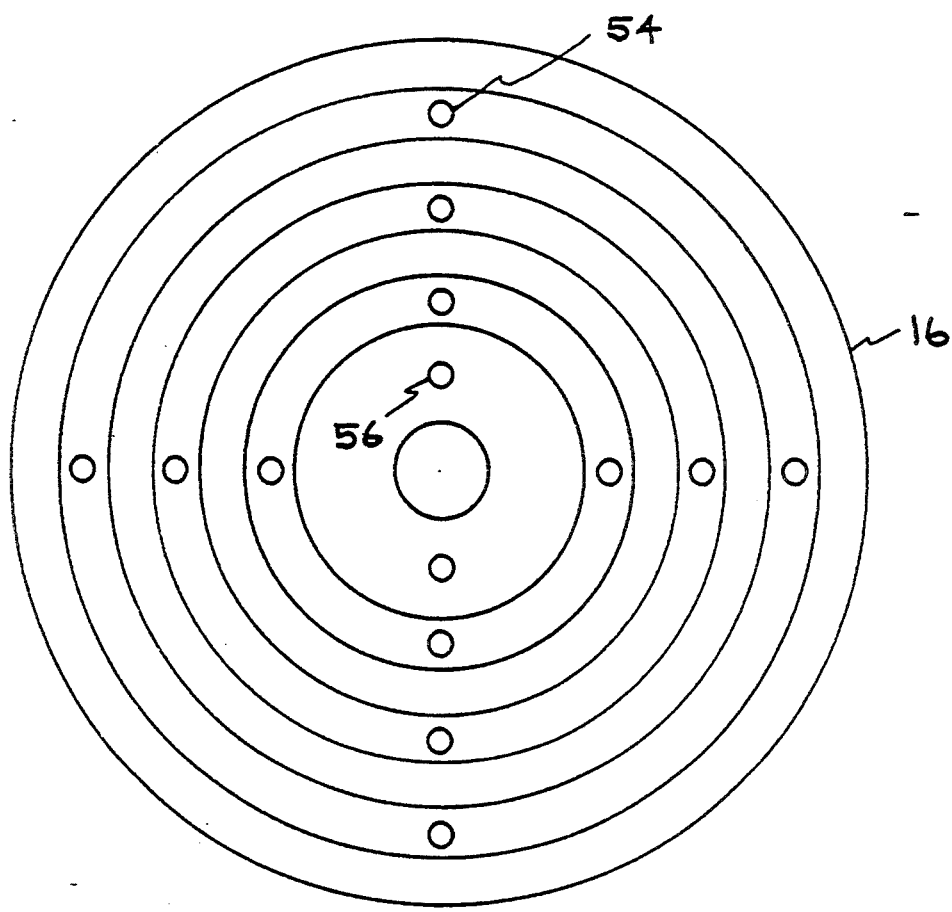
FIGS. 2a and 2b show a rotary top housing.
Figure 2B:
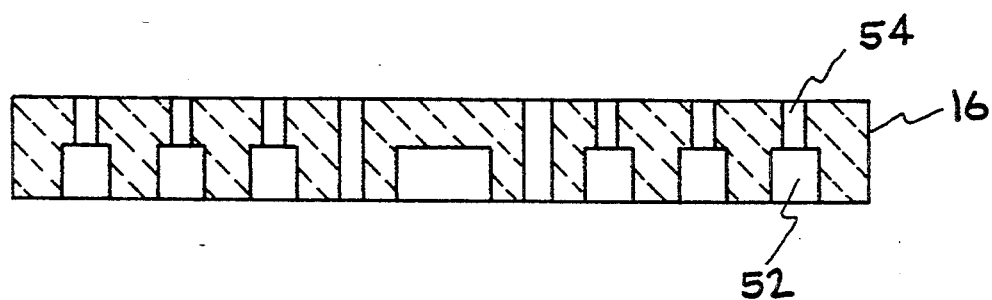

FIGS. 2a and 2b show top and side views respectively of rotary top housing 16. Top housing 16 of one embodiment has a thickness of 0.250 inch, a 2.145 inch diameter and is formed of at least 99.5% alumina (Al$_2$O$_3$). Three ring seats 52 are cut into the bottom half of top housing 16, wherein electrical bearing rings 18

(FIG. 1) are seated. Twelve 5/64 inch through holes 54 are centered four per electrical ring.

Figure 3A:
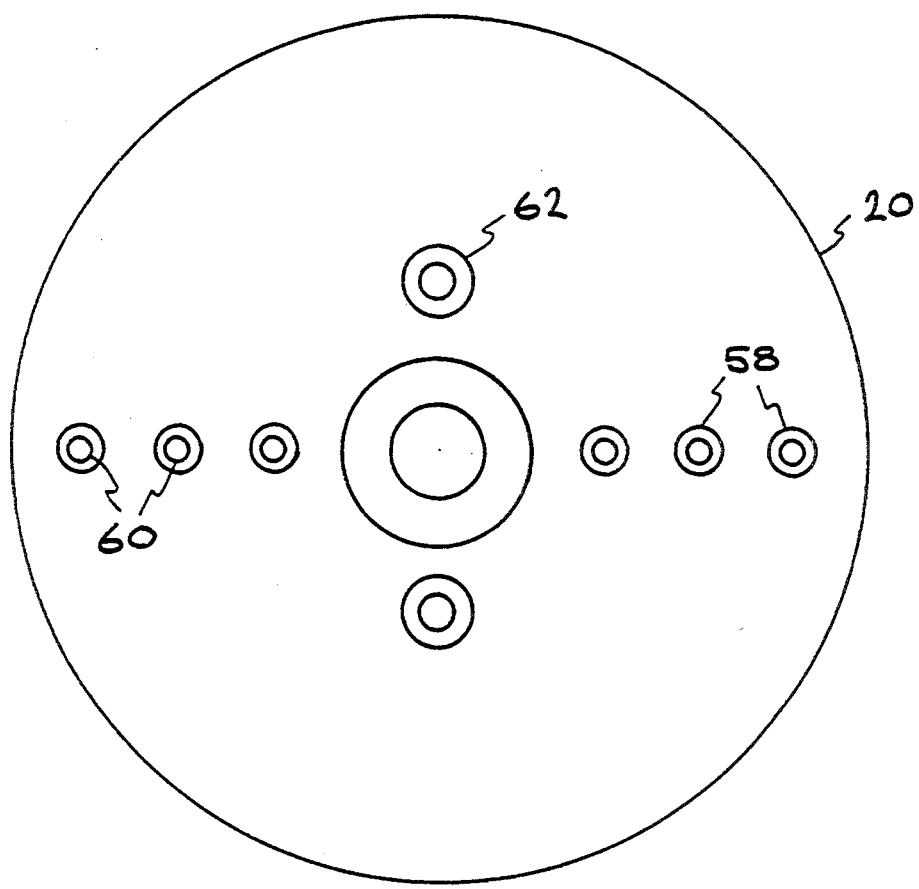
FIGS. 3a and 3b show a rotary bearing bottom housing.
Figure 3B:
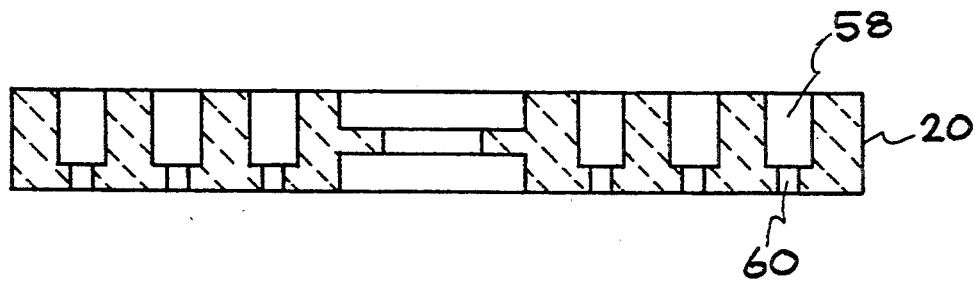

Referring now to FIGS. 3a and 3b, rotary bearing bottom housing 20 is 0.500 inch thick, 2.145 inches in diameter, and is formed of 99.5% alumina ($Al_2O_3$). Six counterbored holes 58 of 0.125 inch (in.) diameters, for copper graphite brushes 24 (FIG. 1) and stainless steel springs 26 (FIG. 1), are cut from the top of rotary bearing bottom housing 20, and have 0.062 in. diameter through holes 60 centered therein. Six holes allow the addition of another power supply to increase the heater current. Housing 20 also has two counterbored holes 62 for 4-40 cap screws.

A heater usable in accordance with the present invention includes the material sold under the trademark Boralectric by Advanced Ceramics Company, which material is a combination of pyrolitic boron nitride and pyrolitic graphite to form a resistance heating element. The heater was able to heat a niobium sample, 0.080 inch thick by 0.500 inch diameter to 700° C. The bearing base did not exceed 150° C. during nine different 8-hour runs. There was no evidence of any galling or seizing during these runs. The sample was rotated at 20 rpm. Using a turbomolecular pump, the nominal working pressure was $8 \times 10^{-10}$ Torr. Another heater usable in accordance with the present invention comprises a molybdenum housing with a ceramic potted material to form a resistive heating element. The uniqueness of the invention lies in the rotation and the means of supplying electrical voltage to the heater and sample under UHV in a reliable and efficient manner. The main problem was to find materials that would be compatible with UHV and be able to withstand high temperatures and low outgassing rates. A suitable material would not gall or seize without using any lubricants and would be capable of sustaining substantial voltage and current without getting too hot. The real contribution of the UHV heating and rotating stage is to be able to heat a specimen to high temperature and rotate it during ion sputter cleaning in an ultrahigh vacuum environment. Heating the specimen to high temperatures drives the contaminants from the bulk of sample to the surface, where it can be removed by the ions. Rotating the specimen in front of the ion beam enhances the flatness and cleanliness of the specimen's surface by evenly exposing it to the incoming ion beam.

The first tests that were conducted to prove the reliability of the UHV heating and rotating stage were run on a portable UHV pumping system. These tests showed the invention to be very reliable. The UHV heating and rotating specimen stage is designed to work in any analytical UHV chamber. Ideally, the chamber will have two 2.75- to 1.33-in.-diameter ports for feedthroughs: one to supply rotational drive and one for electrical power leads. The portable UHV pumping system used to conduct the first heating tests consisted of a turbomolecular pump with a 450-liter-per-second pumping speed, backed up by a 16-cfm mechanical roughing pump. There was a liquid-nitrogen trap between the mechanical pump and the turbomolecular pump.

The portable vacuum test chamber was a four-way, 6-in.-diameter, stainless-steel cross with 8-in.-diameter, metal-seal, conflat flanges. The cross was mounted directly on top of the turbomolecular pump, attached to an 8-in. conflat flange. On the left side of the cross was a reducing flange that reduced the original 8-in.-diameter port down to two 2.75-in. diameters with a 1.5-in-diameter hole through the center of each 2.75-in. port. A rotary feedthrough was mounted in the 1.5-in.-diameter hole. This feedthrough had a ¼-in.-diameter shaft, which extended into the center of the cross, where it coupled with a sleeve into a right-angle-head gear drive unit. The drive unit was then attached to the bottom of a rigid metal support frame on the inside face of an 8-in.-diameter flange and inserted into the left 8-in. port on the cross.

Above the drive unit was a metal base frame, upon which the invention was attached by means of two #4-40 cap screws, which were inserted into through holes in the base plate and screwed into tapped threaded holes in the bottom of the alumina base of the invention. Before the invention was screwed down, a sleeve was attached to the top gear and held in place with a set screw. This sleeve had a spring for loading and a ball hexagonal wrench tip about ½ in. long. The hexagonal wrench tip engaged a hexagonal recess in the bearing support shaft. When the shaft turned, it rotated the specimen heater top assembly. To rotate the specimen heater for these tests, a variable-speed electric motor was adjusted to a speed of 20 rpm. Grooved pulleys are attached to the external rotary feedthrough and on the motor, then a ⅛-in. rubber belt is placed over the pulleys. This was used to minimize any motor vibration.

The electrical power and thermocouple leads were fed through on two 2.75-in.-diameter, metal-seal flange feedthroughs mounted on a single 8-in.-diameter reducing flange. This flange, with the assembled feedthroughs, was then attached to the right side of the vacuum cross. The power source for the specimen heater was a variable, 15-Vdc, 5-A power supply.

An optical pyrometer was used to accurately read the specimen temperature. Viewing through an 8-in.-diameter glass viewport mounted on top of the vacuum chamber cross, a clear direct view was visible through the viewport down on top of the sample specimen as it registered in the specimen heater holder.

A temperature-calibration test confirmed that the pyrometer temperature was correct. A dummy niobium sample with a type K thermocouple spot-welded to its side was placed onto the specimen heater holder stage. The vacuum chamber was evacuated, and the pyrometer was calibrated against the thermocouple reading. During this calibration test, the sample did not rotate. The calibration test confirmed temperature accuracy to 750° C. While conducting these tests, the temperature of the bottom half of the alumina base housing was monitored by placing another type K thermocouple attached to its side. During these tests, the base temperature never exceeded 150° C.

The general steps for heating and rotating a specimen under ultrahigh vacuum according to the present invention are as follows:

1. Insert the specimen into the vacuum chamber onto the specimen holder.
2. Evacuate the chamber.
3. Turn on the specimen rotation mechanism.
4. Increase the voltage to the heater a predetermined level.

More specifically, the steps for simultaneously heating and rotating a specimen under ultrahigh vacuum according to the present invention are as follows:

1. Insert a specimen sample into a vacuum chamber on top of a specimen holder.
2. Rough pump the vacuum chamber with a mechanical roughing pump to about 20 mTorr.

3. Fill a liquid-nitrogen trap of the vacuum chamber.
4. Turbomolecular pump the vacuum chamber for about 2 hours.
5. Turn on a specimen sample rotation mechanism.
6. Supply 15-Vdc power to the specimen heater.

The steps for vacuum evacuation, sample rotation, and specimen sample heating for another embodiment of the present invention are as follows:

1. Remove the 5/16-in. bolts (20 of them) from the top 8-in.-diameter conflat flanged viewport (the sample loading port).
2. Remove the flange and its used 8-in. copper seal gasket.
3. Insert the specimen (i.e; niobium) sample into the vacuum chamber and place it directly on top of the specimen heater holder stage.
4. Clean the sealing surface of the conflat flange with a clean wipe and alcohol.
5. Install a new copper seal gasket.
6. Place the 8-in. viewport on top of the gasket and flange.
7. Replace the 5/16-in. bolts in the flange and tighten by hand.
8. Using a torque wrench, torque the bolts clockwise to 19 ft-lb and then to 23 ft-lb.
9. Turn on the mechanical roughing pump. After pumping down to 20 mTorr, fill the liquid nitrogen trap.
10. Start the turbomolecular pump and pump for 2 hr.
11. Place electrical heater tapes around the vacuum cross and flanges and then wrap the chamber with aluminum foil.
12. Turn on the heater tapes and bake the vacuum system for 12 hr at 150° C.
13. Turn the heater tapes off and let the vacuum chamber cool to room temperature.
14. Check and record the vacuum. In our case, it was $8 \times 10^{-10}$ Torr.
15. Turn on the specimen sample rotation.
16. Turn on the 15-Vdc power supply for the specimen heater. (Note: be sure that the power setting on the supply is at zero.) Record vacuum pressure and thermocouple temperature.
17. Start ramping the voltage up, first to 6 V. The current will ramp up to ~1.5 A. Hold for ten minutes. Record the vacuum pressure and the thermocouple temperature.
18. Ramp the voltage up to 10 V. The current will ramp to ~3.0 A. Hold for 10 minutes, then record the vacuum pressure, the thermocouple temperature, and (with the pyrometer) the sample temperature.
19. Ramp the voltage up to 14 V. The current will ramp to ~4.0 A. Hold for 30 minutes, then record the vacuum pressure, the thermocouple temperature, and the sample temperature.

Steps 15 through 19 were conducted on nine different 8-hr runs, with repeatable results. After the sample temperature was stable at 700° C., the rotation was left running for 8 hr. The vacuum pressure was $8 \times 10^{-10}$ Torr.

Changes and modifications in the specifically described embodiments can be carried out without departing from the scope of the invention, which is intended to be limited by the scope of the appended claims.

I claim:

1. An apparatus for simultaneously heating and rotating a specimen under ultrahigh vacuum, said apparatus including a vacuum chamber having therein:

a rotary top housing;
a plurality of concentric electrical bearing rings supported within said rotary top housing;
a heater stand fixedly connected to said rotary top housing;
a heater fixedly connected to said heater stand;
a thrust bearing shaft fixedly connected to said rotary top housing;
a rotary bearing shaft fixedly connected to said rotary top housing;
a rotary bearing bottom housing having a plurality of counterbored holes aligned with said electrical bearing rings, said thrust bearing being rotatably mounted in said rotary bearing bottom housing, wherein said rotary bearing bottom housing is fixedly connected to said vacuum chamber;
electrical contacting means positioned within said counterbored holes; and
means for rotating said thrust bearing within said rotary bearing bottom housing;
wherein said vacuum chamber comprises means for achieving a vacuum of $1 \times 10^{-9}$ torr or less.

2. The apparatus of claim 1, further comprising means for providing linear loading to said electrical contacting means.

3. The apparatus of claim 1, wherein said rotary top housing comprises at least 99.5% alumina ($Al_2O_3$).

4. The apparatus of claim 1, wherein said electrical bearing rings comprise stainless steel.

5. The apparatus of claim 1, wherein said heater comprises a resistance heating element.

6. The apparatus of claim 5, wherein said resistance heating element comprises pyrolitic boron nitride and pyrolitic graphite.

7. The apparatus of claim 5, wherein said resistance heating element comprises ceramic potted-within a molybdenum housing.

8. The apparatus of claim 1, wherein said rotary bearing bottom housing comprises at least 99.5% alumina ($Al_2O_3$).

9. The apparatus of claim 1, further comprising current providing means electrically connected to said heater.

10. The apparatus of claim 9, wherein said current providing means comprise a variable 15 volt, 5 ampere power supply.

11. The apparatus of claim 1, wherein said electrical contacting means comprise electrically conducting brushes.

12. The apparatus of claim 11, wherein said electrically conductive brushes comprise oxygen free copper and less than 2% graphite.

13. The apparatus of claim 2, wherein said wherein said linear loading means comprises springs.

14. The apparatus of claim 13, wherein said springs comprise stainless steel.

15. The apparatus of claim 1, wherein said thrust bearing shaft comprises a key slot to facilitate rotation.

16. The apparatus of claim 15, wherein said rotating means comprise a shaft fixedly connected on one end to said key slot and fixedly connected on the other end to a rotatable shaft of an electric motor.

17. The apparatus of claim 1, further comprising ball bearings located between said thrust bearing shaft and said rotary bearing bottom housing.

18. The apparatus of claim 1, further comprising a tantalum plate bonded to said heater stand and said heater.

* * * * *